US006958943B1

(12) United States Patent
Chan et al.

(10) Patent No.: US 6,958,943 B1
(45) Date of Patent: Oct. 25, 2005

(54) PROGRAMMABLE SENSE AMPLIFIER TIMING GENERATOR

(75) Inventors: Yuen H. Chan, Poughkeepsie, NY (US); Timothy J. Charest, West Hurley, NY (US); John R. Rawlins, New Paltz, NY (US); Arthur D. Tuminaro, Lagrangeville, NY (US); Jatinder K. Wadhwa, Wappingers Falls, NY (US); Otto M. Wagner, Altdorf (DE)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 10/844,301

(22) Filed: May 12, 2004

(51) Int. Cl.[7] .............................................. G11C 7/00
(52) U.S. Cl. ....................... 365/194; 365/205; 365/233
(58) Field of Search ............................... 365/194, 205, 365/233

(56) References Cited

U.S. PATENT DOCUMENTS

| 4,425,633 | A | 1/1984 | Swain |
| 5,414,714 | A | 5/1995 | Gladden et al. |
| 5,633,606 | A | 5/1997 | Gaudet et al. |
| 5,682,353 | A | 10/1997 | Eitan et al. |
| 5,757,718 | A | 5/1998 | Suzuki |
| 5,771,196 | A | 6/1998 | Yang |
| 5,951,702 | A | 9/1999 | Lim et al. |
| 6,108,266 | A | 8/2000 | Weier et al. |
| 6,111,796 | A | 8/2000 | Chang et al. |
| 6,128,248 | A * | 10/2000 | Idei et al. ............... 365/233 |
| 6,181,626 | B1 | 1/2001 | Brown |
| 6,385,101 | B1 | 5/2002 | Chang et al. |
| 6,404,663 | B2 | 6/2002 | Shinozaki |
| 6,462,998 | B1 | 10/2002 | Proebsting |
| 6,512,709 | B1 * | 1/2003 | Nakahara et al. ........... 365/200 |
| 6,564,344 | B1 | 5/2003 | Bui et al. |

FOREIGN PATENT DOCUMENTS

JP 2000-285687 10/2000

OTHER PUBLICATIONS

"Fast Dram Sensing with Sense Amplifiers Synchronous to Bitline Delays," *IBM Technical Disclosure Bulletin*, Mar. 1987, pp. 4637-4639, vol. 29, No. 10.

* cited by examiner

*Primary Examiner*—Son T. Dinh
(74) *Attorney, Agent, or Firm*—Lynn L. Augspurger; Laurence J. Marhoefer

(57) ABSTRACT

A SRAM sense amplifier timing circuit provides various delay settings for the sense amplifier enable signal (sae) and the sense amplifier reset signal (rse) in order to allow critical timing adjustments to be made for early mode, late mode conditions by varying the timing or with of the sense amplifier output pulse. These timing adjustments are programmable using scan in bits.

4 Claims, 4 Drawing Sheets

TIMING DIAGRAM FOR SENSE AMPLIFIER TIMING GENERATOR

PROGRAMMABLE SENSE AMPLIFIER TIMING GENERATOR

RELATED APPLICATIONS

This application is related to the following applications filed of even date herewith, assigned to the assignee of this application, and incorporated herein by reference: High Performance Programmable Array Local Clock Generator, Ser. No. 10/843,991; Cache Late Select Circuit, Ser. No. 10/844,301; Output Driver With Pulse to Static Converter, Ser. No. 10/844,298.

FIELD OF THE INVENTION

This invention relates to an improved circuit for generating the enable and reset signals for the sense amplifier of a CMOS static RAM, and more particularly to a circuit that enables the adjustment of these signals by means of level scan test bits.

BACKGROUND

Sense amplifier circuit timing is very critical to the overall performance a static RAM. The sense amplifier amplifies the differential voltage that is presented on the bit lines during a read operation. The timing of the sense amplifier has a major impact on the read or write through access time of the static RAM. FIG. 1 is a schematic diagram of a typical CMOS static RAM (SRAM) sense amplifier. Prior to a read operation, the SRAM bit line signals "sti" and "sci" are pre-charged to Vdd by lowering reset enable signal ("rse"). When the read operation starts, the "rse" signal is disabled and one of the bit lines is pulled lower, depending on the content of the selected memory cell. Once a significant voltage is developed across the bit lines, the sense amplifier is enabled lowering the sense enable signal "sae" and the sense amplifier amplifies the differential signal to full rail voltage. The sense amplifier output is a dynamic signal whose leading edge depends upon the arrival of the "sae" signal and whose trailing edge depends upon the arrival of the "rse" signal.

In CMOS SRAM design, in order to guarantee data integrity, it is necessary to maximize the signal to noise ratio of the data being transferred from the bit line and bit switch circuitry to the sense amplifier. This can be accomplish by insuring that the differential voltage on a given bit line pair during a READ mode operation is >=(0.15 * VDD), before the sense amplifier enable signal ("sae") is launched, where VDD is the SRAM supply voltage. Also the sense amplifier restore signal (RSE), which restores the bit lines to VDD must be orthogonal to (i.e. not overlap) the SAE signal, in order to prevent a signal collision, which can result in an excessively high current, and can put the bit lines in an indeterminate state. The "sae" and "rse" signals directly effect the dynamic output of the sense amplifier and the overall operation of the SRAM.

SUMMARY OF THE INVENTION

An object of this invention is the provision of a sense amplifier-timing generator, which has programmable settings to adjust the timing of the sense enable and reset signals.

Another object of the invention is the provision of a sense amplifier-timing generator with programmable settings to adjust the sense enable and reset signal timing by means of the scan bits. Scan bits and scan as used herein refer to level sensitive scan design, which is widely used in the art and is described, among other places, in U.S. Pat. No. 4,488,259, which is incorporated herein by reference.

Briefly, this invention contemplates the provision of an SRAM sense amplifier timing circuit to provide for flexibility in the sense enable "sae" signal and the reset sense enable "rse" signal. The circuit provides various delay settings for the "sae" and "rse" signals in order to allow critical timing adjustments to be made for early mode, late mode conditions by varying the timing and/or width of the pulse output of the sense amplifier. These timing adjustments are programmable into an SRAM after its manufacture using scan in test bits stored in scan only latches. Level sensitive scan design for test and other functions is well known and widely used in the art, and is described more fully in U.S. Pat. No. 4,488,259 assigned to the assignee of this application and incorporated herein by reference.

DETAIL DESCRIPTION OF THE INVENTION

Figure 2:
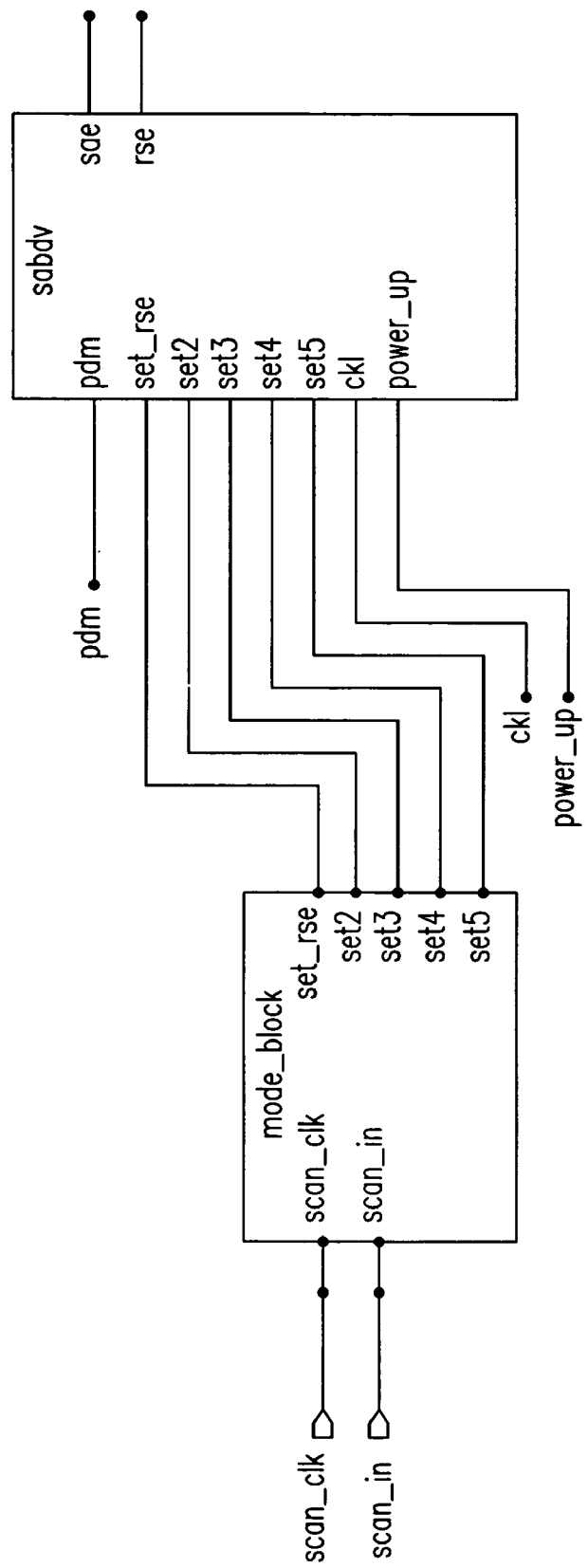
FIG. 2 is a block diagram of a scan bit decode and programmable timing circuit inputs.

Referring now to FIG. 2, the sense amplifier programmable timing circuit has a "power up" input signal that provides a power saving feature by disabling the generation of the "sae" and "rse" signals, shutting off timing to the sense amplifier and thus inhibiting read operation. The input "pdm" is a dynamic signal generated from the word line decoder/driver, not shown here. When a word line is selected, it triggers the "pdm" signal to go active high, starting the sae and rse timing generation. Inputs "set2" through "set5" are steady state latched logic signals that provide various timing settings for the sense enable signal sae. Similarly the latched logic signals "set_rse" provides for two delay settings for the reset enable pulse, rse. All of the signals "set2 through set5" and the "set_rse" are provided by five scan only latches, which are part of the mode block. In this way a desired sequence can be set via the scan only latches.

Figure 3:
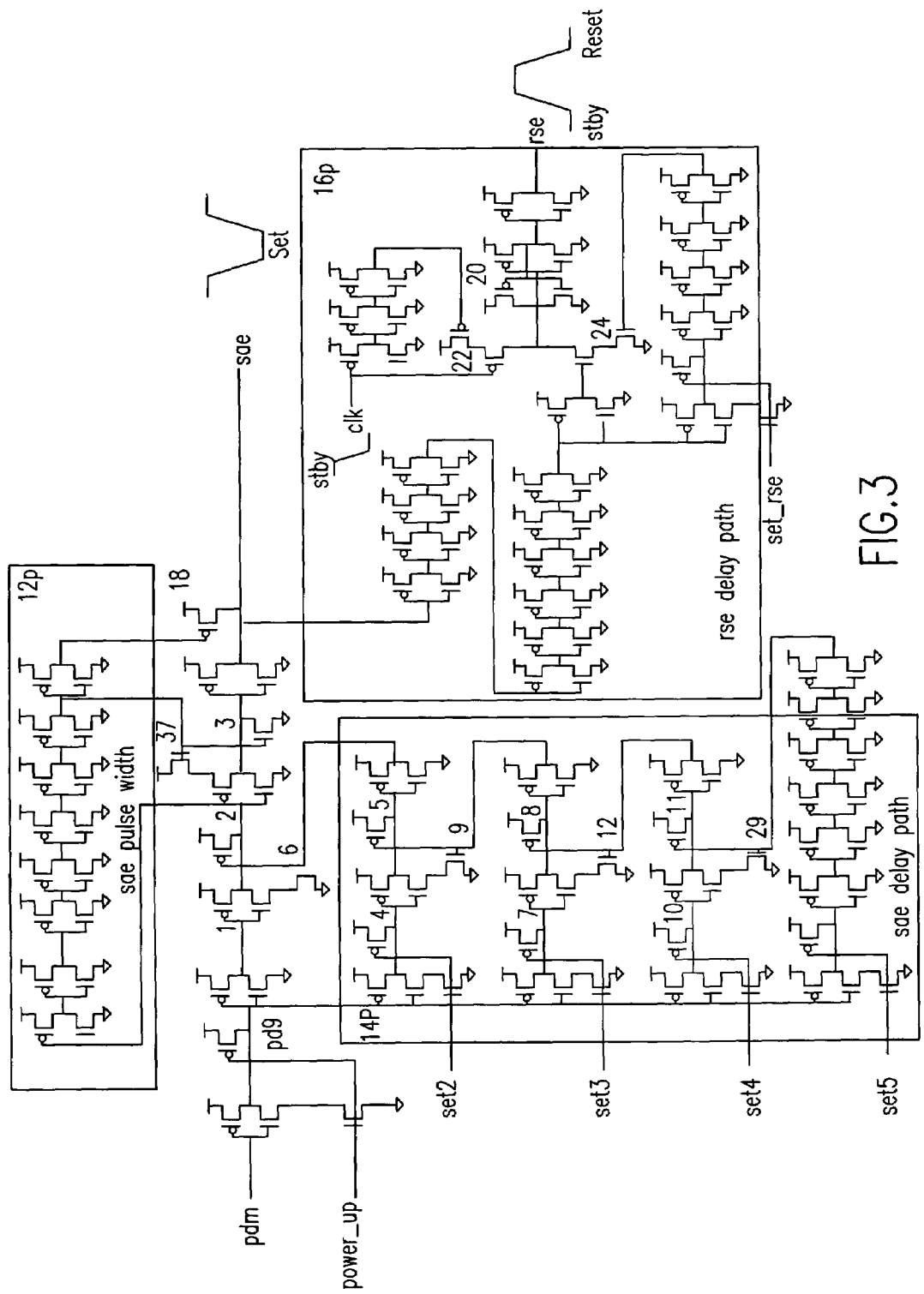
FIG. 3 is a schematic of one embodiment of a programmable timing generator for an SRAM sense amplifier.
Figures 4, 5:
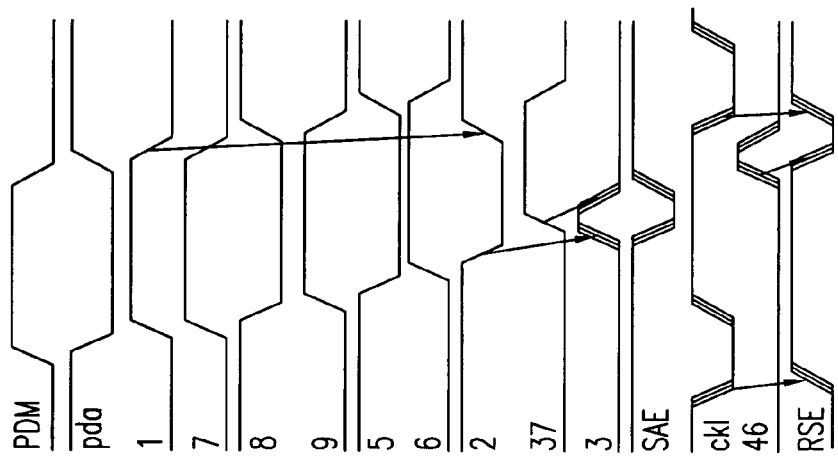
FIG. 4 is timing diagram showing the logic states at various nodes in FIG. 3 for the settings indicated in the drawing.
FIG. 5 is a chart of valid settings for the specific embodiment of the invention shown in FIG. 3.

Referring now to FIGS. 3 and 4, as can be seen in FIG. 3, the programmable timing generator has an sae pulse width path 12p, an sae delay path 14p programmed through the orthogonal inputs set2 through set5 and a rse delay path 16p that can be adjusted by the input set_rse. As will be appreciated by those skilled in the art, each delay path is comprised of FET invertors.

Figure 1:
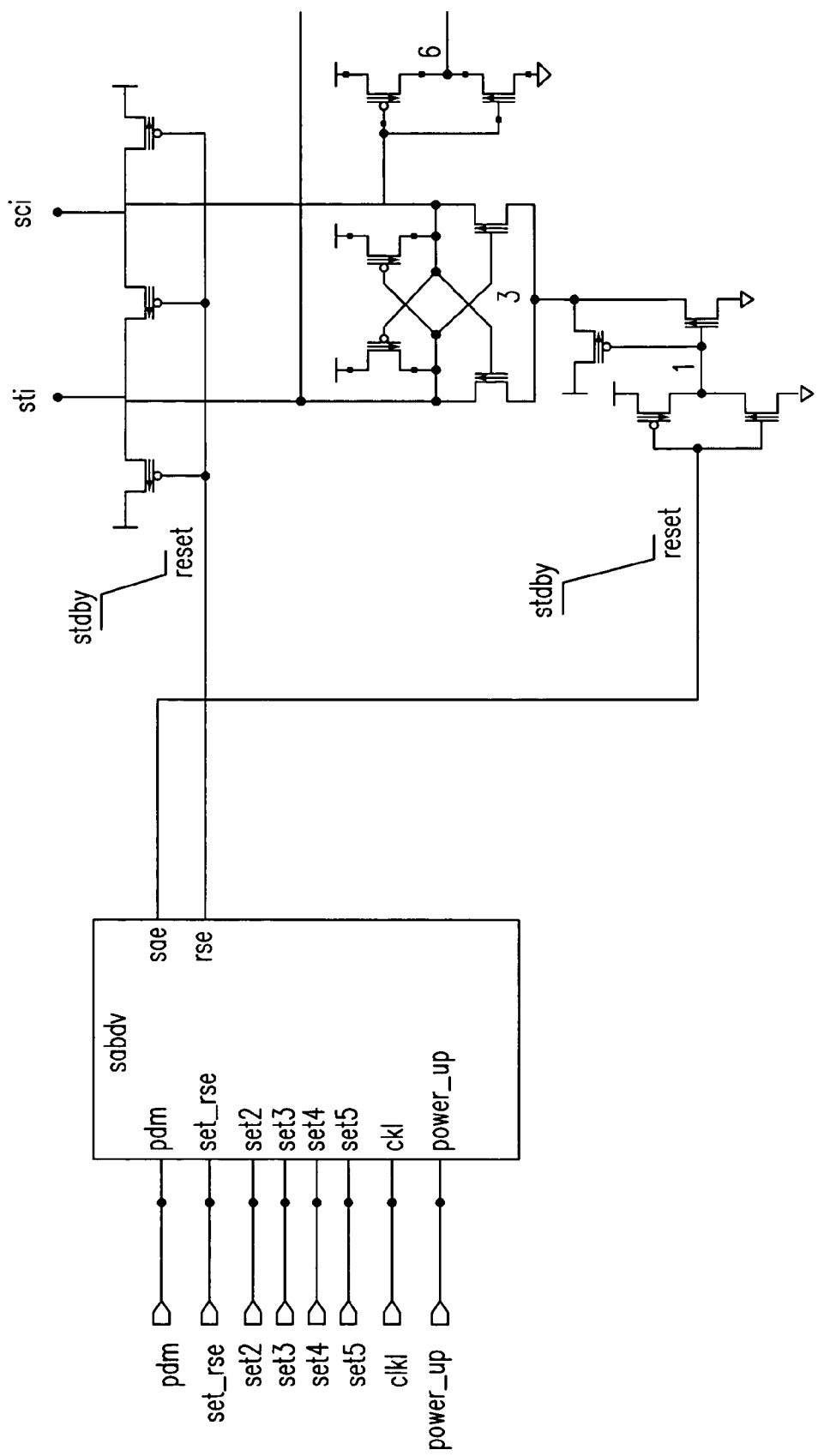
FIG. 1 is a schematic diagram of an SRAM sense amplifier and block diagram of a programmable timing generator in accordance with the teachings of this invention.

When any given array word line is activated, a pulse detect signal is generated for that particular word line. The pulse detect signals for all the array word lines are fed through an OR tree, the result of which is the PDM signal at the input of the programmable timing generator (See FIG. 1).

In addition to the PDM signal, set_rse and set2 through set5 from the "programmable delay block" are the inputs, which can be programmed by scanning in the correct pattern to give the desired SAE delay. The remaining two inputs are the clkl signal, which is used to create the rising edge of the SET-RSE signal, and the power-up signal, which is a power savings feature, and is activated when the array is disabled.

Referring to the schematic in FIG. 3, the initial states of the input signals in this specific embodiment of the invention is as follows. The PDM signal is "0" in standby mode. Also, the power-up signal is a "1" for normal array operation. The term SETTINGS is defined as, SETTINGS: ={set2, set3, set4, set5}. Assume that SETTINGS= {0, 0, 0, 0}. This would yield the shortest delay path from PDM to SAE. Also, assume that set_rse is initially "0". Finally, the initial, or standby state of clkl is "1".

Given the above initial states, node 1 of FIG. 3 is a "0". Therefore node 2 is a "1", node 3 is a "0", node 37 is a "0", and SAE is a "1". With the launching of the PDM signal to a "1", node 1 is driven to a "1". Node 6 is initially "1", so node 2 is driven low. Therefore node 3 is driven high, which generates the low active edge of the SAE signal. The eight-stage delay through the "sae pulse width" block sets the SAE pulse width. The SAE output is restored high by the pull-up pfet 18 at the SAE node whose gate is driven by the output of the delay chain in the "sae pulse width" block. The additional pfet pull-up at the SAE node allows a strong pull-up on a highly capacitive SAE output network without degrading the transition time on the internal node 3.

Early in the cycle (see FIG. 5), the clkl signal is launched to its low active state which sets the left side of the latch 20 in the "rse_delay path" to a "1". Note that the clkl signal and a delayed out of phase clkl signal drive stacked pfet's 22, which cuts off the pfet stack after a 3 stage delay of the clkl signal. The purpose of cutting off the pfet stack is to not allow the potential for the delayed SAE signal in the "rse_delay path" to collide with the nfet stack 24 also accessing the left side of the latch. Also note that the 11 stages of delay in the "rse delay path" are greater than the SAE pulse width, which is determined by the 8 stages of delay in the "sae pulse width" block. This guarantees orthogonality between the trailing SAE and initial RSE signals in a given cycle. So the RSE signal is not activated while SAE is still active.

The SAE signal can be incrementally delayed by raising any one of the elements in the SETTINGS pattern to a "1". The valid SETTINGS patterns are shown in the chart of FIG. 4. Note that, SETTINGS={1, 0, 0, 0} would add the smallest delay increase to the SAE signal, while {0, 0, 0, 1} would add the largest. Assuming that SETTINGS={0, 0, 0, 0}), then we have that nodes 29, 12, 9, and 6 are all at a "1". As noted above, this creates the shortest delay path from the PDM input signal to the SAE output through nodes pda, 1, 2, and 3. Suppose now, that SETTINGS={0, 1, 0, 0}. Then we have that nodes 29 and 12 are at a "1". When the PDM signal switches to a "1", pda transitions from a "1" to "0", and the following transitions take place, and can be seen on the graph of FIG. 5:
node 7 from "0" to "1"
node 8 from "1" to "0"
node 9 from "0" to "1"
node 5 from "1" to "0"
node 6 from "0" to "1"

So the signal at node 1 does not pass through the receiving nand gate 30 until node 6 switches from a "0" to "1". In the above example, the SAE signal development was delayed by 4 stages (Note that the stage delay from pda to node 7 is comparable to the delay from pda to node 1). If SETTINGS={0, 0, 1, 0}, then the SAE signal development would be delayed by 6 stages, etc. This helps us achieve a varying delay on the development of the SAE and RSE pulses.

Finally, the RSE signal can be delayed an additional increment by activating the set_rse signal to a "1". This would delay the nfet stack in the rse delay path from activating and bringing the left side of the latch to a "0" by 4 stages. This allows more timing flexibility between the SAE and RSE signals, and can be helpful in determining the bitline restore boundary.

While the preferred embodiment of the invention has been described, it will be understood that those skilled in the art, both now and in the future, may make various improvements and enhancements which fall within the scope of the claims which follow. These claims should be construed to maintain the proper protection of the invention described herein.

What is claimed is:

1. A programmable timing generator for an SRAM sense amplifier comprising in combination:
   a. a word line activation signal input terminal to said generator for receiving a word line activation signal;
   b. a sense amplifier enable signal output terminal,
   c. a programmable sense amplifier enable signal delay path coupled between said word line activation signal input terminal and said sense amplifier enable signal output terminal, including a plurality of delay element sets that may be alternatively inserted in said enable signal delay path in response to programmable inputs in order to adjust the timing of a leading edge of a sense amplifier enable signal in response to a leading edge of word line activation signal;
   d. a sense amplifier enable signal pulse width path coupled to said sense amplifier enable signal delay path in order to establish a trailing edge time of said sense amplifier enable signal;
   e. a sense amplifier reset path coupled to coupled to said sense amplifier enable signal delay path and to a sense amplifier reset output terminal, said sense amplifier reset path introducing a programmable variable delay between an a clock signal that initiates a leading edge of the reset signal at said reset signal output terminal and a trailing edge of the reset signal initiated from said enable signal delay path.

2. A programmable timing generator for an SRAM sense amplifier as in claim 1 wherein said programmable sense amplifier delay path includes a plurality of selectable sets of delay elements.

3. A programmable timing generator for an SRAM sense amplifier as in claim 1 wherein programmable delays are established by level scan bits.

4. A programmable timing generator for an SRAM sense amplifier as in claim 2 wherein programmable delays are established by level scan bits.

* * * * *